United States Patent
Krebs et al.

(10) Patent No.: US 12,396,202 B2
(45) Date of Patent: Aug. 19, 2025

(54) VERTICAL FIN FIELD EFFECT TRANSISTOR, VERTICAL FIN FIELD EFFECT TRANSISTOR ARRANGEMENT, AND METHOD FOR FORMING A VERTICAL FIN FIELD EFFECT TRANSISTOR

(71) Applicant: Robert Bosch GmbH, Stuttgart (DE)

(72) Inventors: Daniel Krebs, Aufhausen (DE); Joachim Rudhard, Leinfelden-Echterdingen (DE); Alberto Martinez-Limia, Tuebingen (DE); Jens Baringhaus, Sindelfingen (DE); Wolfgang Feiler, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 575 days.

(21) Appl. No.: 17/788,653

(22) PCT Filed: Feb. 15, 2021

(86) PCT No.: PCT/EP2021/053596
§ 371 (c)(1),
(2) Date: Jan. 5, 2023

(87) PCT Pub. No.: WO2021/165183
PCT Pub. Date: Aug. 26, 2021

(65) Prior Publication Data
US 2023/0118158 A1    Apr. 20, 2023

(30) Foreign Application Priority Data
Feb. 18, 2020  (DE) .................. 10 2020 202 038

(51) Int. Cl.
*H01L 21/78*    (2006.01)
*H01L 29/08*    (2006.01)
(Continued)

(52) U.S. Cl.
CPC .......... *H10D 30/62* (2025.01); *H10D 30/024* (2025.01); *H10D 30/6219* (2025.01);
(Continued)

(58) Field of Classification Search
CPC .. H10D 30/62; H10D 30/024; H10D 30/6219; H10D 62/151; H10D 62/235;
(Continued)

(56) References Cited

U.S. PATENT DOCUMENTS 8,207,581 B2 *  6/2012  Takasu ................ H10D 89/811
                                                              257/349
8,837,204 B2 *  9/2014  Asa .......................... H03K 3/288
                                                              365/154

(Continued)

FOREIGN PATENT DOCUMENTS

DE    102005060702 A1    6/2007
WO       2019191465 A1    10/2019

OTHER PUBLICATIONS

International Search Report for PCT/EP2021/053596, Issued Apr. 30, 2021.

*Primary Examiner* — Jarrett J Stark
(74) *Attorney, Agent, or Firm* — NORTON ROSE FULBRIGHT US LLP (57) ABSTRACT

A vertical fin field-effect transistor. The transistor has a semiconductor fin, an n-doped source region, an n-doped drift region, an n-doped channel region in the semiconductor fin situated vertically between the source region and the drift region, a gate region horizontally adjacent to the channel region, a gate dielectric electrically insulating the gate region from the channel region, a boundary surface between the gate dielectric and the channel region having negative boundary surface charges, a p-doped gate shielding region situated below the gate region so that, given the vertical projection, the gate shielding region is situated within a
(Continued)

surface limited by the gate dielectric, a source contact electrically conductively connected to the source region, and an electrically conductive region between the gate region and the p-doped gate shielding region. The p-doped gate shielding region is electrically conductively connected to the source contact by the electrically conductive region.

13 Claims, 13 Drawing Sheets (51) Int. Cl.
    H10D 30/01      (2025.01)
    H10D 30/62      (2025.01)
    H10D 62/13      (2025.01)
    H10D 62/17      (2025.01)
    H10D 84/85      (2025.01)
(52) U.S. Cl.
    CPC ......... H10D 62/151 (2025.01); H10D 62/235 (2025.01); H10D 84/853 (2025.01)
(58) Field of Classification Search
    CPC .. H10D 84/853; H10D 30/635; H10D 30/025; H10D 64/017; H10D 62/107; H10D 62/8325; H10D 62/8503; H10D 64/117; H01L 27/0886; H01L 21/823468; H01L 21/31053; H01L 21/823437; H01L 21/823431
    See application file for complete search history.

(56) References Cited

U.S. PATENT DOCUMENTS

| | | | |
|---|---|---|---|
| 9,208,880 B2 * | 12/2015 | Louie | G11C 15/04 |
| 9,257,348 B2 * | 2/2016 | Xie | H10D 64/021 |
| 9,287,362 B1 * | 3/2016 | Basu | H10D 30/6728 |
| 9,306,032 B2 * | 4/2016 | Lin | H01L 21/28247 |
| 9,318,336 B2 * | 4/2016 | Breil | H10D 84/0191 |
| 9,368,625 B2 * | 6/2016 | Louie | G11C 11/4099 |
| 9,450,099 B1 * | 9/2016 | Chang | H01L 21/31116 |
| 9,508,825 B1 * | 11/2016 | Basker | H01L 21/31116 |
| 9,601,493 B2 * | 3/2017 | Widjaja | G11C 11/40 |
| 10,186,514 B1 * | 1/2019 | Tao | H10D 64/231 |
| 2002/0135010 A1 * | 9/2002 | Sheu | H01L 21/7687 |
| | | | 257/E21.507 |
| 2005/0161732 A1 | 7/2005 | Mizukami et al. | |
| 2005/0179093 A1 * | 8/2005 | Morris | H10D 30/021 |
| | | | 257/E21.544 |
| 2013/0015517 A1 * | 1/2013 | Widjaja | H10B 41/30 |
| | | | 257/316 |
| 2013/0166990 A1 * | 6/2013 | Morris | G06F 11/1008 |
| | | | 714/764 |
| 2013/0175594 A1 * | 7/2013 | Basker | H10B 12/038 |
| | | | 438/155 |
| 2013/0320458 A1 * | 12/2013 | Deng | H10D 89/10 |
| | | | 257/390 |
| 2014/0015036 A1 | 1/2014 | Fursin et al. | |
| 2015/0364326 A1 * | 12/2015 | Xie | H10D 30/0212 |
| | | | 438/585 |
| 2016/0027901 A1 * | 1/2016 | Park | H01L 21/31051 |
| | | | 438/300 |
| 2016/0240624 A1 * | 8/2016 | Zhu | H01L 21/76897 |
| 2016/0260833 A1 * | 9/2016 | Basker | H10D 30/6212 |
| 2016/0308012 A1 * | 10/2016 | Song | H10D 30/024 |
| 2016/0308016 A1 * | 10/2016 | Choi | H10D 30/6219 |
| 2016/0315045 A1 * | 10/2016 | Baek | H01L 21/76804 |
| 2016/0315171 A1 * | 10/2016 | Hung | H10D 64/015 |
| 2016/0322471 A1 * | 11/2016 | JangJian | H10D 64/017 |
| 2016/0336420 A1 * | 11/2016 | Chou | H10D 64/017 |
| 2016/0336426 A1 * | 11/2016 | Chang | H10D 64/021 |
| 2016/0343827 A1 * | 11/2016 | Wu | H10D 64/018 |
| 2016/0351687 A1 * | 12/2016 | Costrini | H01L 21/76283 |
| 2016/0365449 A1 * | 12/2016 | Chang | H10D 64/258 |
| 2017/0338224 A1 * | 11/2017 | Wong | H10D 30/475 |
| 2018/0033859 A1 * | 2/2018 | Feil | H01L 21/283 |
| 2020/0006500 A1 * | 1/2020 | Rajan | H10D 30/6739 |
| 2020/0098885 A1 * | 3/2020 | Then | H10D 30/47 |
| 2020/0235013 A1 * | 7/2020 | Lilak | H10D 30/0241 |
| 2023/0118158 A1 * | 4/2023 | Krebs | H10D 62/8325 |
| 2025/0113586 A1 * | 4/2025 | Pandey | H10D 30/0241 |

* cited by examiner

Fig. 3A distance from the SiC/oxide boundary surface (nm)

Fig. 3B distance from the SiC/oxide boundary surface (nm)

Fig. 3C distance from the SiC/oxide boundary surface (nm)

Fig. 3D distance from the SiC/oxide boundary surface (nm)

VERTICAL FIN FIELD EFFECT TRANSISTOR, VERTICAL FIN FIELD EFFECT TRANSISTOR ARRANGEMENT, AND METHOD FOR FORMING A VERTICAL FIN FIELD EFFECT TRANSISTOR

FIELD

The present invention relates to a vertical fin field-effect transistor (FinFET), a vertical fin field-effect transistor system, and a method for forming a vertical fin field-effect transistor.

BACKGROUND INFORMATION

For the use of semiconductors having a wide band gap (e.g. SiC or GaN) in power electronics, power MOSFETs having a vertical channel region are typically used. Here, the channel region is formed adjacent to a trench, so that this type of MOSFET is also referred to as a trench MOSFET (TMOSFET). Through suitable choice of geometry and doping concentrations of epitaxial, channel, and shielding regions, a relatively low switching resistance and a relatively high breakdown voltage can be achieved.

According to the related art, a power trench MOSFET has a deep p+ implantation as shielding region and a trench that are periodically combined in alternating fashion to form a cell field made up of a plurality of individual MOSFETs, also referred to as cells. The proportions of the trench, p+ shielding region, and a channel region formed between them that is switchable by an insulated gate results from the demands of achieving a switching resistance that is as low as possible, a maximum field load at the gate dielectric that is as low as possible, a saturation current in case of short-circuit that is as low as possible, and a breakdown voltage that is as high as possible. A distance between structures of the same type of adjacent MOSFETs (pitch) is here limited by the technical possibilities of forming the trench, contacting the various regions, and realizing the p+ implantation.

A channel resistance of the TMOSFET is determined by the charge carrier distribution in the channel and the mobility thereof. These two variables are decisively determined by boundary surface charges at a boundary surface between the semiconductor material in the channel region and the gate dielectric, or by charges in the gate dielectric and by the channel doping. The cell pitch is decisively determined by the p+ shielding region, because in order to produce it high energy implantations are required that in turn presuppose a sufficiently thick mask. The thickness of this mask limits the smallest dimension that can be opened, and via this limits the cell pitch.

SUMMARY

In various exemplary embodiments of the present invention, a vertical fin field-effect transistor (vertical FinFET, or FinFET for short; in a FinFET, the switchable component is made up of a narrow semiconductor fin) is provided having a trench contact for a shielding structure. Graphically described, in the vertical fin field-effect transistor the shielding structure is situated directly below the trench, and is connected in electrically conductive fashion to an electrically conductive contact formed in the trench.

Through its geometry and through a suitable choice of material and manufacturing process of the gate dielectric, a particularly low channel resistance can be enabled.

The contacting of the shielding structure by the trench can enable a particularly small cell pitch.

The FinFET can for example be used as a power FinFET. Accordingly, in various exemplary embodiments a switching resistance of the power FinFET with the trench contact can be significantly lower than in a MOSFET or MISFET based on silicon carbide (SiC) or gallium nitride (GaN) according to the existing art. From this there result lower losses during operation of the overall component.

In various exemplary embodiments of the present invention, a power FinFET is provided having a trench contact to a shielding structure. Dimensions, dopings, and boundary surface charges at a gate dielectric (e.g. gate oxide) can, as explained in more detail below, be set up such that a low switching resistance, a high breakdown voltage, a low short-circuit current, and a low maximum field loading at the gate dielectric can be achieved.

In addition, a method is provided for forming such a FinFET, a relative positioning of the trench and of the shielding structure taking place in self-adjusting fashion. This means that a high degree of relative positioning accuracy can be achieved with simple manufacturing.

Developments of the aspects of the present invention are disclosed herein. Specific embodiments of the present invention are shown in the Figures and are explained in more detail in the following description.

DETAILED DESCRIPTION OF EXAMPLE EMBODIMENTS

Figure 1:
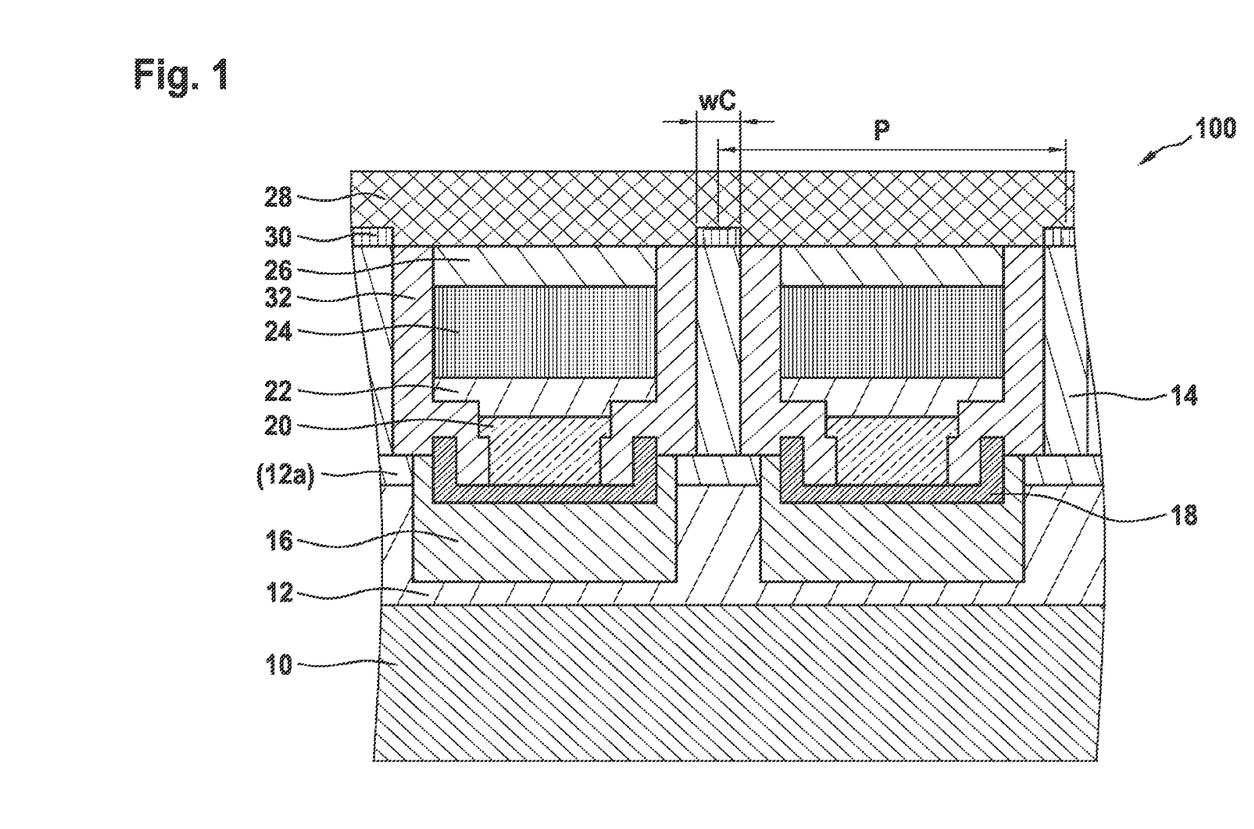
FIG. 1 shows a schematic cross-sectional view of a vertical FinFET according to various exemplary embodiments of the present invention.

FIG. 1 shows a schematic cross-sectional view of a vertical FinFET 100 according to various exemplary embodiments.

Vertical fin field-effect transistor 100 can have an n-doped semiconductor fin 14 (or "fin" for short) that can extend vertically between an n-doped source region 30 (above or in the upper end of fin 14) and an n-doped drift region 10, 12 (below fin 14) of the FinFET. Drift region 10, 12 can have an n-doped drift region 10 and an n-doped spreading region 12. In various exemplary embodiments, a doping concentration can be higher in spreading region 12 than in drift region 10 situated below it, and can be higher than in the n-channel region situated above it in semiconductor fin 14. In an exemplary embodiment, the dopings can be for example $10^{16}$ cm$^{-3}$ in drift region 10, $10^{17}$ cm$^{-3}$ in spreading region 12, and $4 \cdot 10^{16}$ cm$^{-3}$ in the channel region in fin 14. The n-doped semiconductor material of drift region 10, 12 and of fin 14 can be provided as an epitaxially grown material, e.g. grown on a substrate, if appropriate having a buffer layer situated between drift region 10, 12 and the substrate. On a rear side of the substrate, a drain contact can be situated. The substrate, drain contact, and, if present, buffer layer can be produced in a conventional or substantially conventional manner.

In addition, vertical fin field-effect transistor 100 can have at least one gate region 24 that is horizontally adjacent to the channel region. In the exemplary embodiment of FIG. 1, two gate regions 24 are formed horizontally adjacent to fin 14, which gate regions can be electrically insulated from fin 14 by a gate dielectric 32, and from a source contact 28 situated above it by a further dielectric 26. Gate region 24 can include a conductive material, for example polysilicon. In various exemplary embodiments, on the surface thereof the further dielectric 26 can be formed by re-oxidation as an insulation to source contact 28.

Negative boundary surface charges may be present at a boundary surface between gate dielectric 32 and channel region 14, or in gate dielectric 32 itself.

Figure 2A:
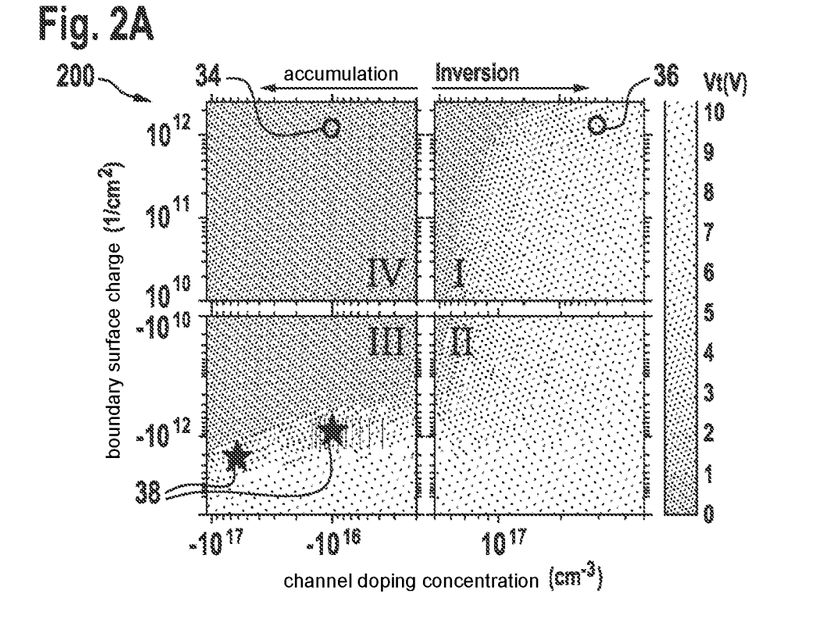
FIG. 2A shows an illustration of threshold voltages in FinFETs as a function of a channel doping concentration and a boundary surface charge.
Figure 2B:
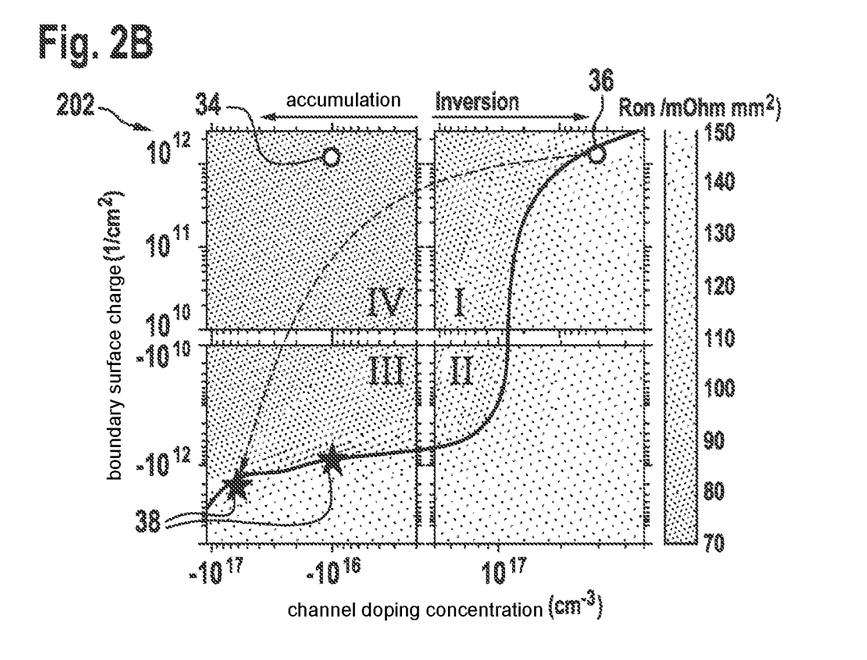
FIG. 2B shows an illustration of switching resistances in FinFETs as a function of a channel doping concentration and a boundary surface charge.

Properties of a FinFET having such a design 100 are shown in FIGS. 2A and 2B, and in FIGS. 3A through 3D.

Figure 3A:
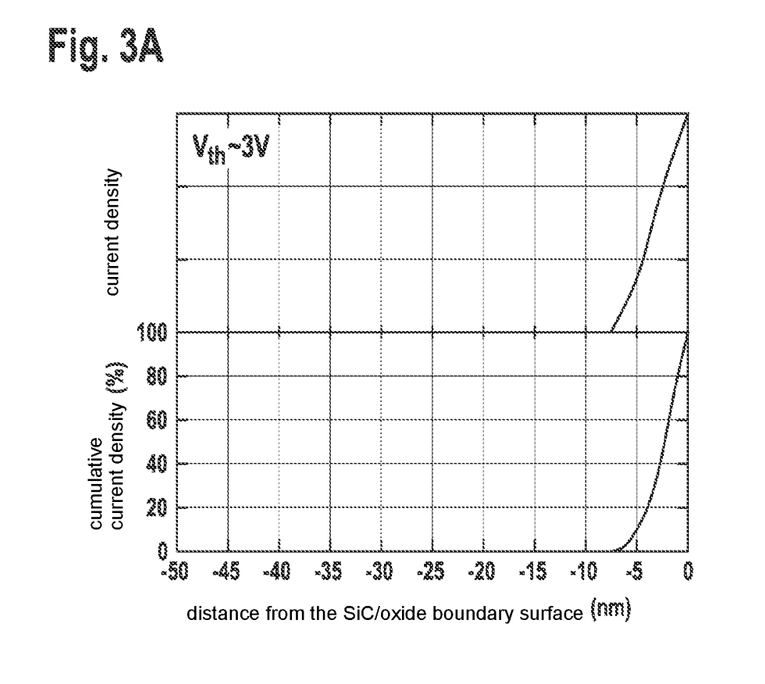
FIG. 3A shows a current density and a cumulative current density as a function of a distance from a SiC/oxide boundary surface in a FinFET.
Figure 3B:
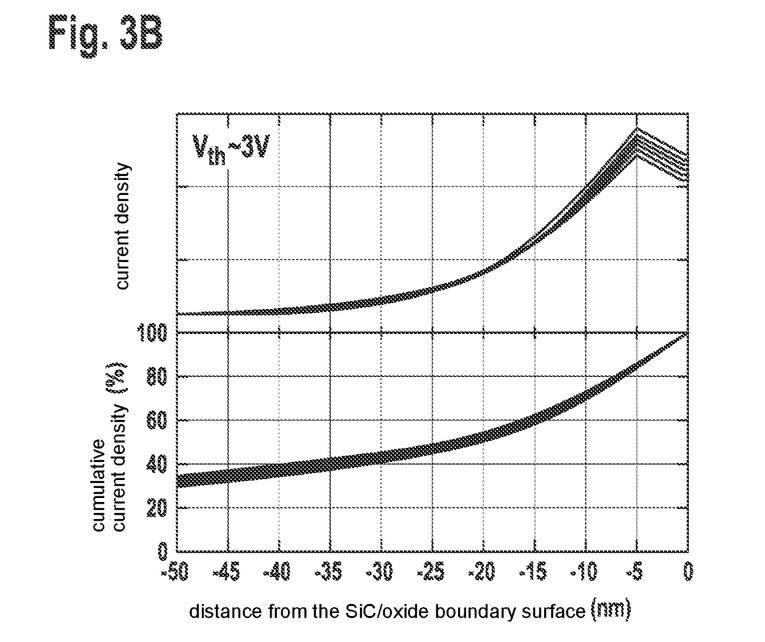
FIG. 3B shows a current density and a cumulative current density as a function of a distance from a SiC/oxide boundary surface in a FIN/FET according to various exemplary embodiments of the present invention.
Figure 3C:
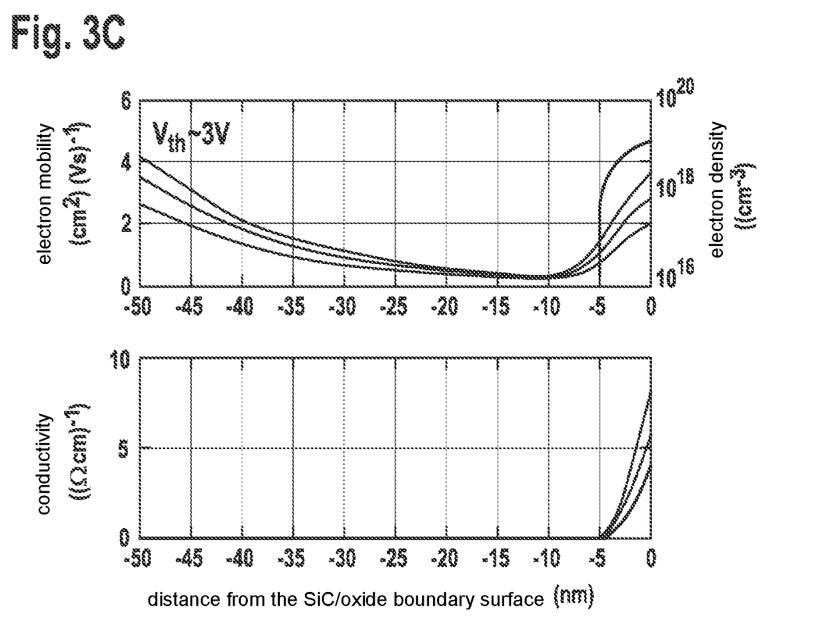
FIG. 3C shows an electron mobility, an electron density, and a conductivity as a function of the distance from a SiC/oxide boundary surface in a FinFET.

In FIG. 2A, an illustration 200 shows threshold voltages Vt in FinFETs as a function of a channel doping concentration and of a boundary surface charge. FIG. 2B shows, in a diagram 202, switching resistances in FinFETs as a function of a channel doping concentration and of a boundary surface charge. FIG. 3A shows a current density (top) and a cumulative current density (bottom) as a function of a distance from an SiC/oxide boundary surface in a FinFET for the case of p-channel doping and positive boundary surface charge (quadrant I in FIG. 2) as the channel is used according to the related art for a TMOSFET. FIG. 3B shows a current density and a cumulative current density as a function of a distance from the SiC/oxide boundary surface in a FinFET for the case of n-channel doping and negative boundary surface charge (quadrant III in FIG. 2) according to various exemplary embodiments. FIG. 3C shows the electron mobility, electron density, and conductivity corresponding to FIG. 3A as a function of a distance from the SiC/oxide boundary surface, and FIG. 3D shows the electron mobility, electron density, and conductivity corresponding to FIG. 3B as a function of a distance from a SiC/oxide boundary surface.

Figure 3D:
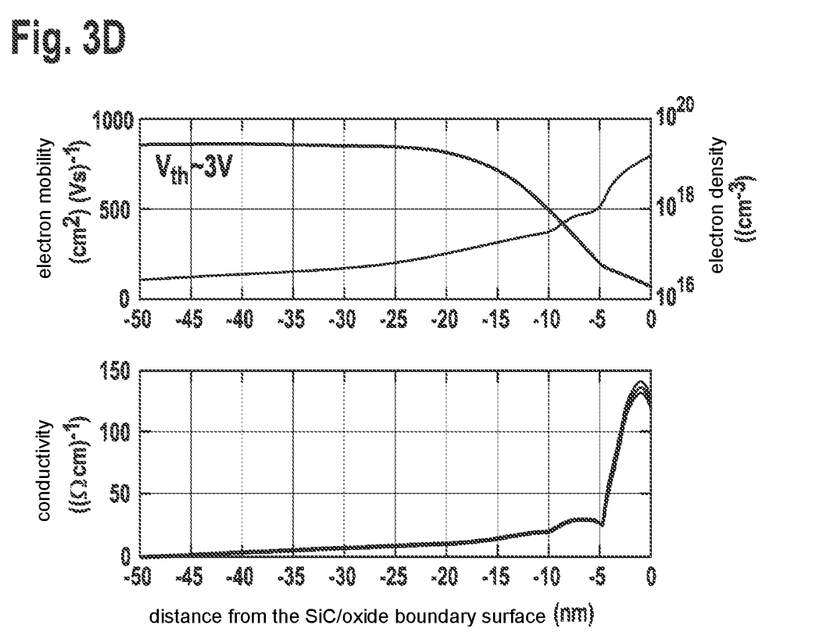
FIG. 3D shows an electron mobility, an electron density, and a conductivity as a function of the distance from a SiC/oxide boundary surface in a FinFET according to various exemplary embodiments.

The channel resistance can be significantly reduced if a transition takes place from a p-doped inversion channel, as is used according to the related art and is shown at the right in FIG. 2A and FIG. 2B, and is shown in FIGS. 3A and 3C, to an n-doped accumulation channel that is shown at the left in FIG. 2A and FIG. 2B, and is shown in FIG. 3B and FIG. 3D.

FIG. 2B symbolically shows a variable of an ON resistor, i.e. for a FinFET in the switched-on state, for a parameter field of channel dopings and boundary surface charges of the FinFET having fins 300 nm wide, and a cell pitch of 800 nm. If, as gate oxide, a silicon dioxide tempered in a nitrogen oxide atmosphere is used (as in the existing art), an inversion channel is formed having a positive boundary surface charge. This corresponds to circle 36 in the first quadrant (top right) in FIG. 2A and FIG. 2B. If, instead, an accumulation channel is formed having a positive boundary surface charge (circle 34 in the fourth quadrant at top left), then the ON resistance is reduced by approximately a factor of two. However, FinFETs having n-channel doping and positive boundary surface charge have a threshold voltage <0 V, as is shown in FIG. 2A in the fourth quadrant at top left. This is connected to the fact that positive boundary surface charges shift the threshold voltage towards smaller values. Through the selection of a gate dielectric or gate dielectric stack, or of a suitable pre- or post-treatment method, a boundary surface channel-semiconductor material/gate dielectric having negative boundary surface charges can be produced, or negative charges can be built into the gate dielectric.

This can have the result that combinations of boundary surface charges and channel dopings can be ascertained that supply both a suitable positive threshold voltage (e.g. 3 V, black line in FIG. 2B) and also a lower ON resistance than a FinFET having an SiC/gate dielectric boundary surface according to the existing art. These combinations can be found for example in the second and third quadrants, both for inversion (second quadrant) and for accumulation (third quadrant), e.g. along the black line in the second or third quadrant.

In particular, FinFETs that are to be assigned to the third quadrant, e.g. having parameters that are marked by the two stars 38 there, have the advantages described above. In the FinFET 100 according to various exemplary embodiments, the boundary surface charges and the channel doping concentration can be selected according to the simulation results shown in the third quadrant, taking into account the desired threshold voltage, e.g. for 3 V along the black line.

As gate dielectric 32, in various exemplary embodiments a wet-oxidated thermal oxide at 1150° C. can be used, post-treated if appropriate with an NO tempering at 1150° C., or a gate dielectric stack made up of $SiO_2$ and $Si_3N_4$ or $SiO_2$ and $Al_2O_3$ can be used.

As mentioned above, a reason for the reduction of the ON resistance is the charge bearer distribution in the channel, and its mobility. This is illustrated on the basis of a comparison of current densities for inversion channels (FIG. 3A, FIG. 3C) and accumulation channels (FIG. 3B, FIG. 3D), each having 3 V threshold voltage, in the cross-section of fin 14.

While the current density in the inversion channel (FIG. 3A, FIG. 3C) is carried exclusively in the first 5-10 nm to the SiC/gate oxide boundary surface, i.e. assumes significant values only there, the current distribution in the accumulation channel (FIG. 3B, 3D) goes much deeper into fin 14. There, as can be seen in FIGS. 3C and 3D at the bottom, the conductivity is significantly higher. There thus results a higher conductivity in the channel that extends almost over the entire fin width wC (see FIG. 1).

Vertical fin field-effect transistor 100 can in addition have a p-doped gate shielding region 16 that is situated below gate region 24 in such a way that, given a vertical projection, the gate shielding region 16 lies within a surface limited by gate dielectric 32 at least partly, for example for the most part, almost completely, or completely, e.g. with at least 50%, at least 60%, at least 70%, at least 80%, at least 90%, or at least 95% of its projected surface. Gate shielding region 16 can be used to shield gate dielectric 32 on the trench floor from excessively large electrical fields.

Source contact 28 can be connected in electrically conductive fashion to source region 30, and an electrically conductive region 18, 20 can be situated between gate region 24 and p-doped gate shielding region 16, p-doped gate shielding region 16 being capable of being electrically conductively connected to source contact 28 by electrically conductive region 18, 20.

A second parameter that can influence the channel resistance is the cell distance (pitch) P, a smaller pitch P making the channel resistance smaller.

According to the existing art, a shielding region is typically realized by a deep p-implantation. For this implantation, a relatively thick (e.g. approximately 1.5 μm) oxide mask is required, which limits the smallest opening that can be achieved, and thus limits the pitch P.

In various exemplary embodiments, a production method is provided for a FinFET 100 having a reduced cell pitch P. In the method, a shielding structure is provided in that the lithography process that limits the cell pitch is not carried out between two trenches; rather, gate shielding region 16 is formed below the trenches.

In various exemplary embodiments, the same mask can be used for the trench formation and for the shielding implantation. That is, first the trenches are formed, and subsequently a p-doping is implanted into the trenches. In this way, gate shielding region 16 can be formed underneath the trenches.

This means that, using a simple method, according to various exemplary embodiments gate shielding region 16 can be formed in self-adjusting fashion in such a way that a base of fin 14 and corners of the trench are protected.

During the doping process for forming gate shielding region 16, it can happen that a p-doped layer is also formed in the trench side walls. In various exemplary embodiments, this can be oxidized away in the subsequent fin formation process, so that no p-doping is left over in the actual fin 14. Alternatively, a narrow (e.g. a few 10 nm thick) p-doped zone can be left over on the edge of fin 14.

A surface ratio of p-doped gate shielding region 16 to n-doped spreading region 12, their doping concentrations and geometric configuration, and a thickness (depth) of gate shielding region 16 can be determined by a compromise of shielding (maximum field in gate dielectric 32, sufficiently small short-circuit current, and sufficiently high breakdown voltage) and conductivity, with a low (ON resistance) [sic]. In particular, in a specific embodiment spreading region 12 can have a plurality of different doping concentrations, for example $2 \cdot 10^{17}$ cm$^{-3}$ below and around a lower region of shielding region 16, and $5 \cdot 10^{17}$ cm$^{-3}$ between the shielding regions below fin 14, shown in FIG. 1 as an optional second spreading region 12a extending for example up to the dash-dotted line. This can be helpful in order to find a suitable compromise between low switching resistance (high doping between the shielding regions) and high breakdown voltage (low doping underneath the shielding region).

Moreover, in a specific embodiment spreading region 12 can extend into the lower region of fin 14, in particular in the region next to the electrically conductive region 18, 20 that contacts gate shielding region 16. Due to a high doping in this region, this region is conductive even when gate 24 is switched off, and therefore does not have to be switched on by the electrical field of gate 24.

In various exemplary embodiments, p-doped gate shielding region 16 can be connected directly to a source potential (source contact 28) through a contact in the floor of the trench, i.e. electrically conductive region 18, 20. In various exemplary embodiments, electrically conductive region 18, 20 can have a contact layer 18 (for example nickel-silicide). Contact layer 18, or more generally electrically conductive region 18, 20, can be connected to the source metal through a conductive material (for example a doped, or in situ doped, polysilicon). In various exemplary embodiments, electrically conductive region 18, 20 can be electrically insulated from gate region 14 by a dielectric layer 22. In various exemplary embodiments, dielectric layer 22 can be an oxide layer that can be formed for example by thermal oxidation of electrically conductive region 20, for example in a case in which electrically conductive region 20 includes polysilicon. In various exemplary embodiments, the connection (not shown) to the source metal can be realized, analogously to a conventional procedure in the gate connection, via a so-called supercell lead out at the end of the cell field.

In various exemplary embodiments, it can be advantageous to keep a leading out of the connection of gate shielding region 16 to source contact 28 as short as possible in order to reduce the resistance. This has the advantage that the Joule heating is reduced, and the time constant for charging and discharging the shielding region is kept small. Both of these increase the power efficiency of the component. The latter is advantageous in particular for fast switching of the component. In addition, the current path from source contact 28 via electrically conductive region 20 and shielding region 16 into drift region 10 represents a diode that, in diode operation, has to carry current. Therefore, for the functioning of this so-called body diode a low resistance, due to a short leading out of the connection of shielding region 16, can also be helpful.

In various exemplary embodiments, electrically conductive region 18, 20 can be formed completely of metal, e.g. copper or a copper alloy. In this case, metal layer 18, 20 and gate region 24 can be separated from one another by a dielectric 22 that is deposited (e.g. at low temperatures). Metallic layer 18, 20 can be deposited for example according to, or based on, a conventional damascene process. FinFET 100, having electrically conductive region 18, 20, can have increased robustness against high current densities.

Figure 5:
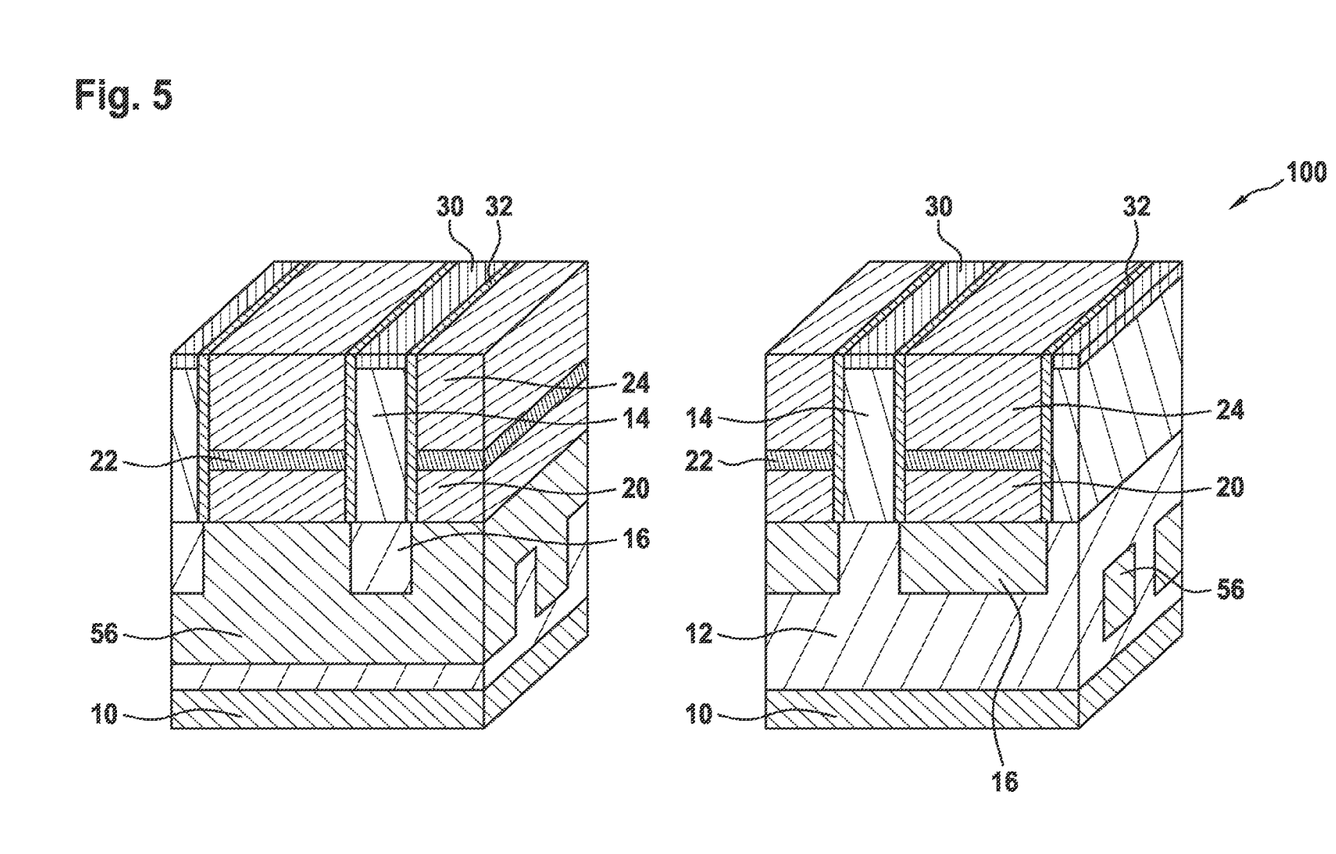
FIG. 5 shows a schematic perspective front and rear view of a FinFET according to various exemplary embodiments of the present invention.

In order to achieve still better shielding, and in particular a higher resistance, with high drain voltages, and thus a low short-circuit current, in various exemplary embodiments vertical FinFET 100 shown in FIG. 5 can in addition have a trenched p-doped layer 56. Trenched p-doped layer 56 can be in contact with gate shielding region 16. In this way, the shielding underneath the trench is made up of gate shielding region 16 and trenched layer 56. In this way, for example an overall depth in the vertical direction of shielding structure 16, 56 of approximately 1 μm can be achieved, in that approximately 500 nm thickness of gate shielding region 16 and approximately 500 nm thickness of trenched layer 56 are combined with one another without having to enlarge cell pitch P.

In various exemplary embodiments, in addition a vertical FinFET system can be provided that has a plurality of vertical FinFETs 100 as described above for various exemplary embodiments. This was already indicated in FIG. 1, FIGS. 4A through 4S, and FIG. 5 through the plurality of fins 14, trenches, etc.

Fins 14 (and correspondingly also the trenches and the gate shielding regions 16 formed below the trenches) can be configured parallel to one another. They can have an elongated geometry, and can be configured parallel to one another along their longitudinal axes. Fins 14, trenches, and gate shielding regions 16 can extend in a first direction.

In order to avoid alignment problems between trenched layer 56 and the structures of FinFETs 100, the trenched p-doped region 56 can have at least one elongated region, e.g. a plurality of elongated regions 56 parallel to one another, that extend(s) in a second direction different from the first direction. In other words, trenched regions 56 can be periodically continued in a direction that is different from the direction in which the trenches are periodically continued (see for example FIG. 5; here the angle between the first direction and the second direction is 90°).

Figure 4A:
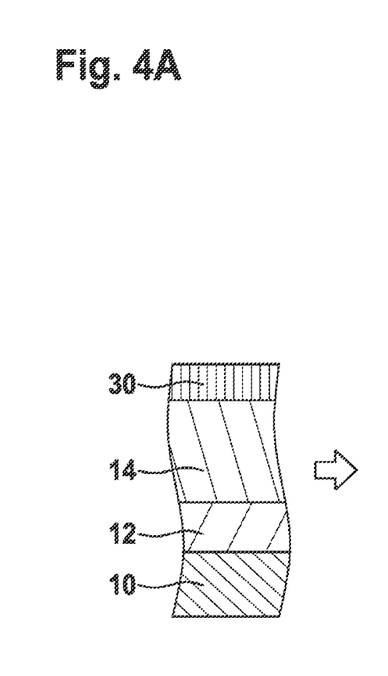
FIGS. 4A through 4S show a schematic illustration of a method for forming a vertical FinFET according to various exemplary embodiments of the present invention.
Figure 4B:
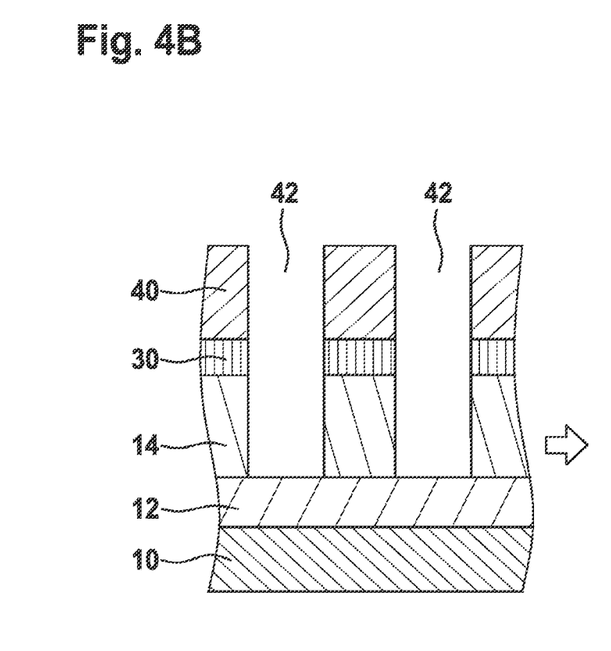
Figure 4C:
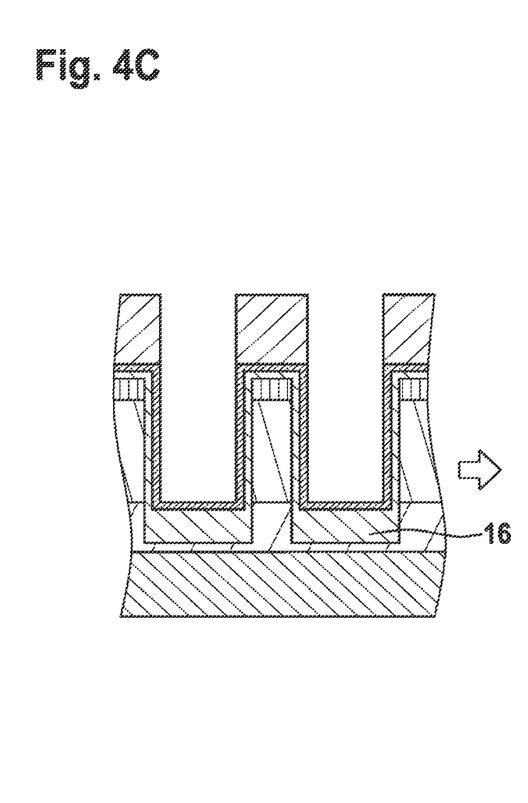
Figure 4D:
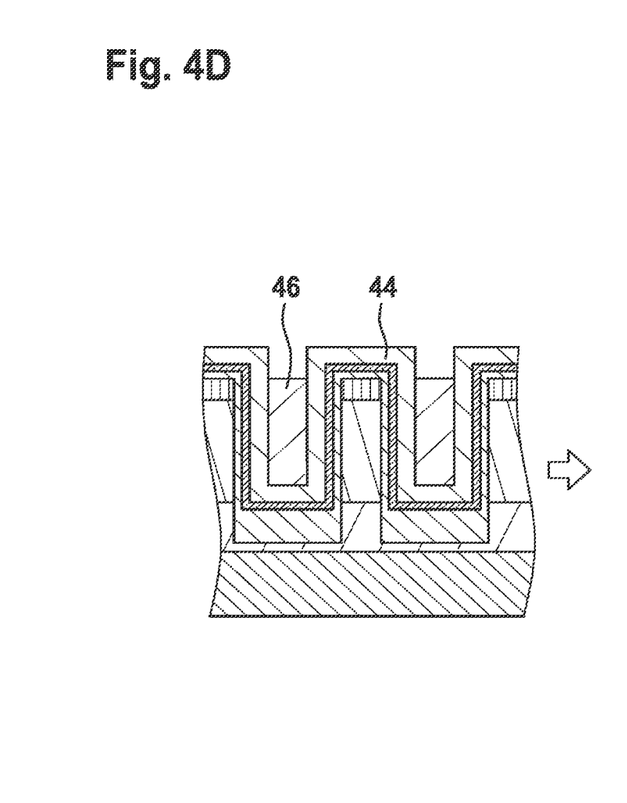
Figure 4E:
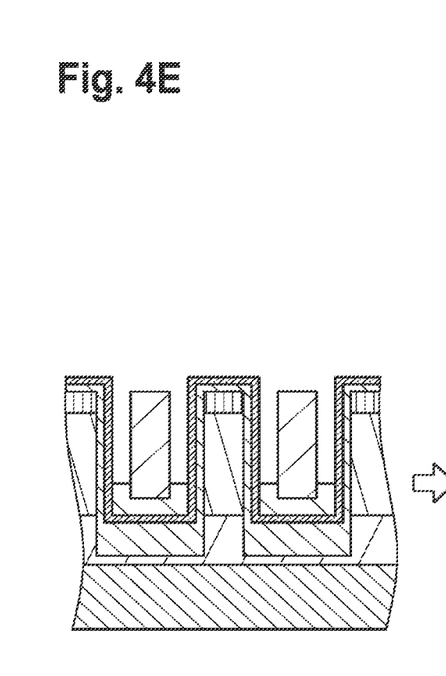
Figure 4F:
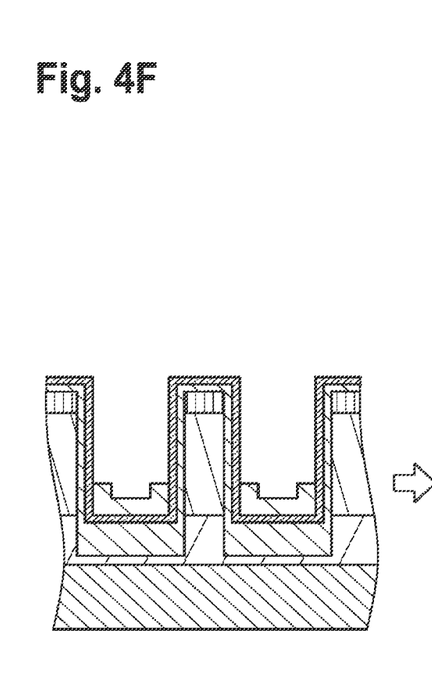
Figure 4G:
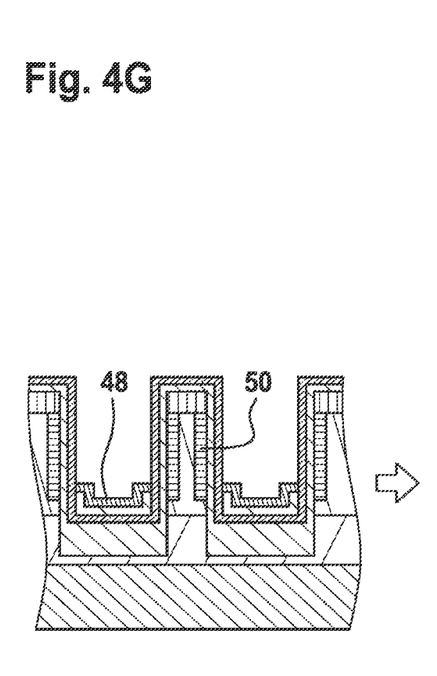
Figure 4H:
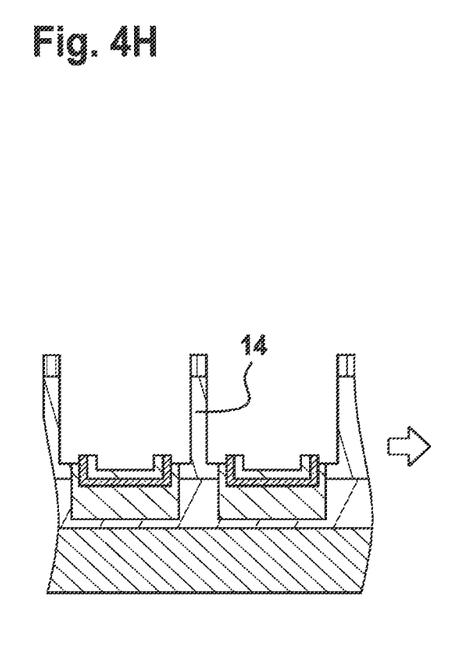
Figure 4I:
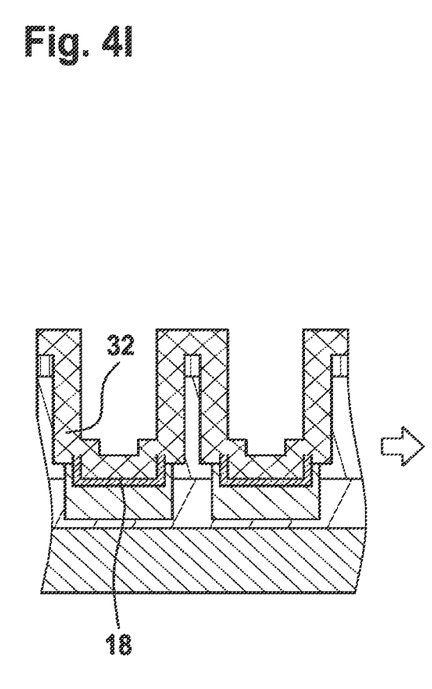
Figure 4J:
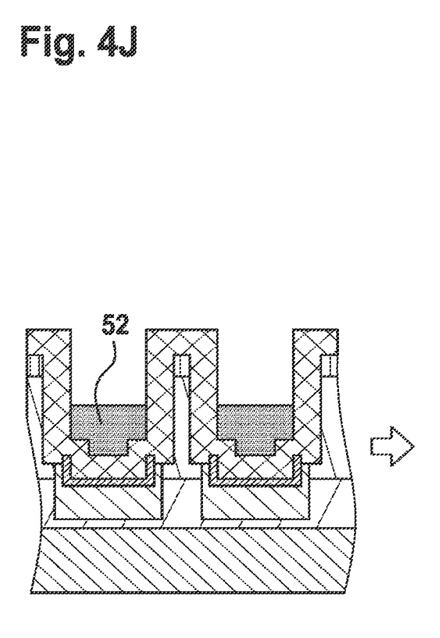
Figure 4K:
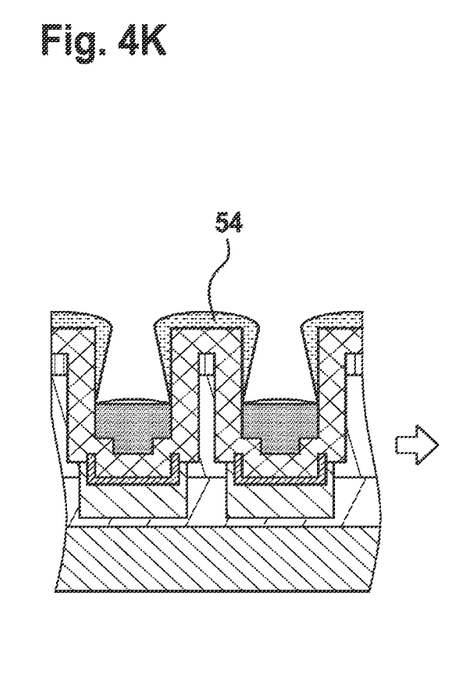
Figure 4L:
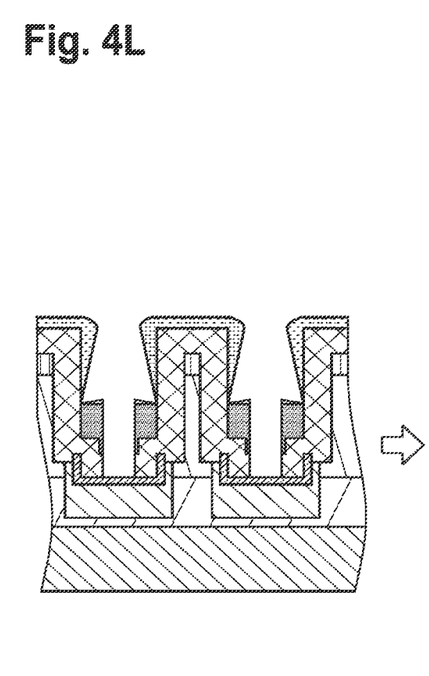
Figure 4M:
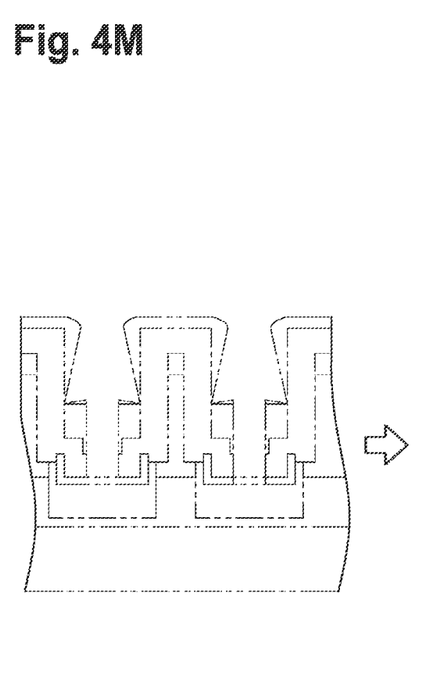
Figure 4N:
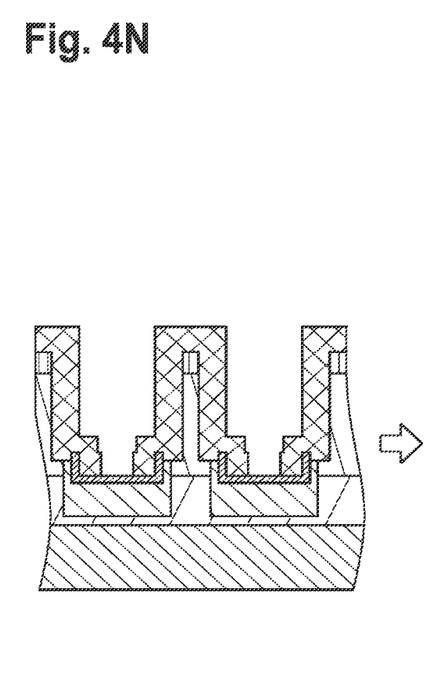
Figure 4O:
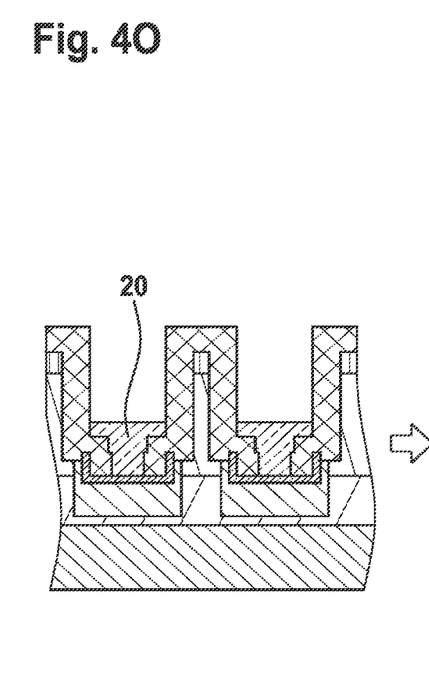
Figure 4P:
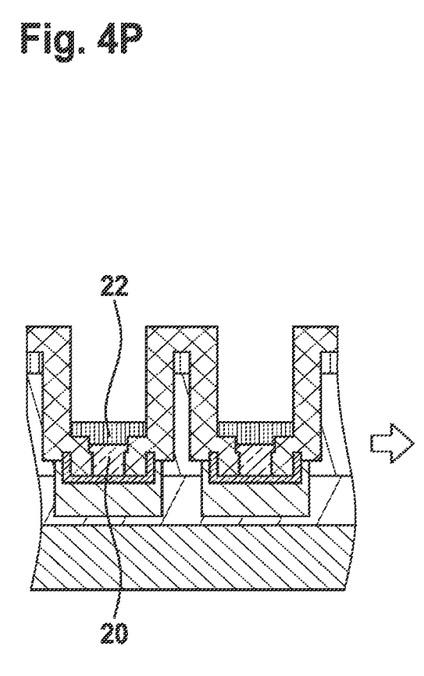
Figure 4Q:
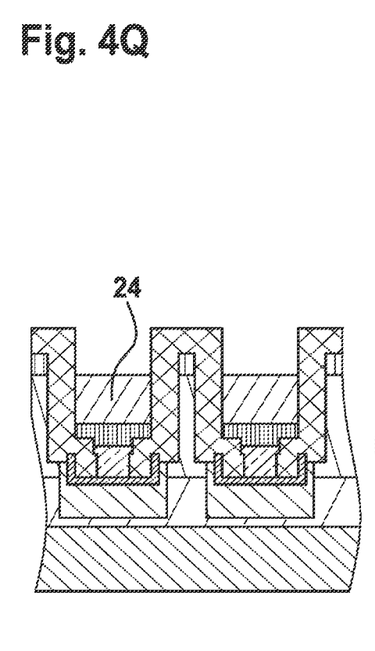
Figure 4R:
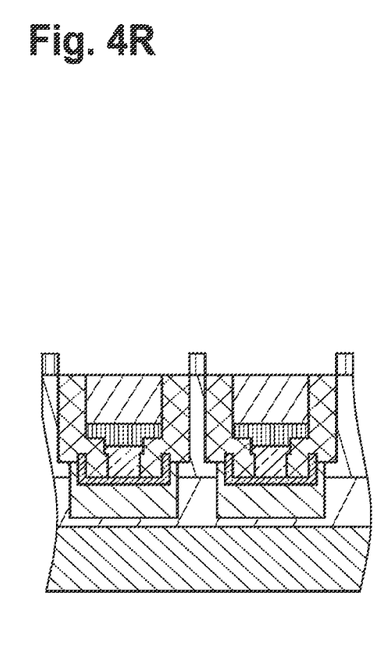
Figure 4S:
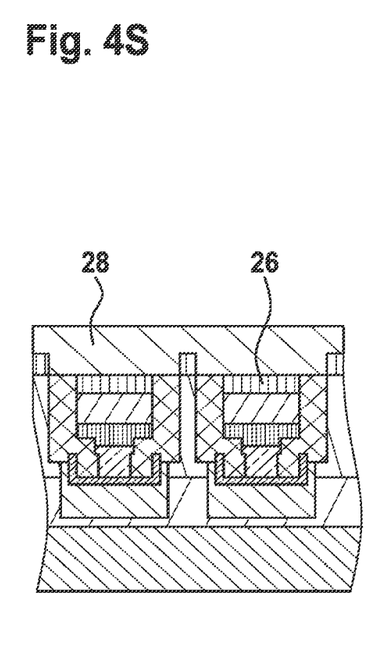

FIGS. 4A through 4S show a schematic illustration of a method for forming a vertical FinFET 100 according to an exemplary embodiment. Properties of elements and other features here may correspond to those described above with reference to vertical FinFET 100.

FIG. 4A: First, an n-doped drift region 10, an n-doped spreading region 12, and an n-doped region (from which fin 14 is later formed) are provided, e.g. by epitaxy. In various exemplary embodiments, fin 14 can extend into spreading region 12. Appropriate doping concentrations here can be for example $10^{16}$ cm$^{-3}$ in drift region 10, $10^{17}$ cm$^{-3}$ in spreading region 12, and $4 \cdot 10^{16}$ cm$^{-3}$ in the channel region in fin 14. There subsequently follows a flat n-contact (source region 30), e.g. having a doping concentration of e.g. $10^{19}$ cm$^{-3}$, which is either implanted into the channel region or is also provided as an epitaxial layer. FIG. 4B: subsequently, trenches 42 are produced by an etching process using a structured mask 40 (e.g. oxide hard mask), the trenches having widths of approximately 800 nm and a depth of approximately 1.4 μm, which can either extend into spreading region 12 or stop before it. During the process, a part of mask 40 can be worn away. FIG. 4C: the remaining thickness of approximately 800 nm can be used as an implantation mask, thus enabling a self-adjusting implantation of gate shielding region 16 through the trench 42. An implantation depth in trench 42 of approximately 500 nm and a doping of $5 \cdot 10^{19}$ cm$^{-3}$ can be achieved with a 0° implantation. Subsequently, mask 40 can be removed, and a contact metal 18 (for example nickel) can be deposited on the surface and alloyed in (e.g. NiSi contact formation using an established RTA process).

FIG. 4D: to form fins 14, first a protection for the trench floor can be provided, by producing a structure (FIG. 4E) via a Si$_3$N$_4$ (reference character 44) and polysilicon (reference character 46) deposition and polysilicon 46 back-etching, the structure subsequently permitting a wet etching of the Si$_3$N$_4$ 44, so that Si$_3$N$_4$ remains only on the floor of the trench (FIG. 4E). The poly-Si 46 is then also removed (FIG. 4F). Now, if the alloyed-in contact metal is oxidizable (e.g. NiSi), through alternating oxidation and oxide etching trench 42 can be laterally enlarged, so that at the end there remain only fins 14 between trenches 42. If the contact metal is not oxidizable, then the alloyed-in contact metal can be selectively removed, before this step (FIG. 4G), selectively to the Si$_3$N$_4$ and the wafer material (e.g. SiC), for example by wet etching. Because the Si$_3$N$_4$ 44 on the trench floor acts as an oxidation barrier, because it oxidizes significantly more slowly than SiC, contact 18 on the floor remains protected. The etching of the oxidized regions simultaneously also removes the oxidized p-implanted regions on the wafer surface and on the trench side wall, which are not wanted (FIG. 4G, FIG. 4H). The Si$_3$N$_4$ protection 44 on the trench floor is subsequently selectively removed, and gate dielectric 32 is produced (FIG. 4I).

The opening for the connection of p-shielding 16 in turn requires some process steps. FIG. 4J, FIG. 4K: Si$_3$N$_4$ can be deposited in such a way (preferably by PECVD or sputter deposition) that overhangs 54 result on fins 14. This is a conventional method having well-understood process windows (process gases, process gas conducting, process pressure, generator frequency and power) for forming overhangs 54 close to the surface on free-standing structures having particular aspect ratios. Using directed etching (taking advantage of collimator effects, for example reactive ion etching (RIE) or ion beam etching (IBE)), gate oxide 32 can then be opened in the floor of trench 42 (FIG. 4L). Alternatively, using a poly-Si mask 52, work can be done in trench 42 in order to modify the aspect ratio of trench 42. In this way, the formation of overhangs 54 can be adapted and the trench side walls can be better protected. In order to expand the contact surface on the floor of the trench, gate oxide 32, which is opened only through the access region on the floor of trench 42, can be wet-etched temporarily in an optional process (FIG. 4M is grayed out for this reason) until most of the floor, but not yet the side wall, is exposed.

After the Si$_3$N$_4$ 54 and, if appropriate, the poly-Si mask 52 have been removed, contact 20 to gate shielding region 16 and gate 24, including insulating layers 22, 26, can be made in trench 42 (FIGS. 4O through 4S). This can be done for example using double polysilicon deposition, polysilicon back-etching, polysilicon re-oxidation, or for example using a damascene process. In the end (FIG. 4S), front side contact 28 and a rear side contact are formed. For this purpose, the oxide was previously (FIG. 4R) removed above source region 30.

Figure 6:
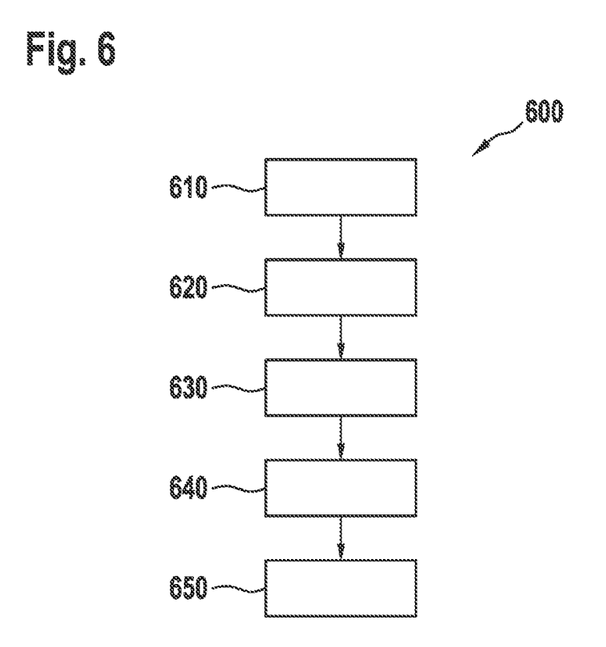
FIG. 6 shows a flow diagram of a method for forming a vertical FinFET according to various exemplary embodiments of the present invention.

FIG. 6 is a flow diagram 600 of a method for forming a vertical FinFET according to various exemplary embodiments.

The method can include a formation of a plurality of trenches in an n-doped semiconductor region, in such a way that between each two of the trenches a semiconductor fin is formed having an n-doped channel region that extends (610) between an n-doped drift region and an n-doped source region, a p-doping of semiconductor regions on the floor of each of the trenches for the formation of p-doped shielding regions (620), a formation of a dielectric layer on the side walls of the trenches (630), a situation in the trenches (640) of electrically conductive material that is in electrically conductive contact with the shielding region situated thereunder in each case, and a formation in each trench of a gate region via the electrically conductive material and electrically insulated therefrom (650).

What is claimed is:

1. A vertical fin field-effect transistor, comprising:
   a semiconductor fin;
   an n-doped source region;
   an n-doped drift region;
   an n-doped channel region in the semiconductor fin, situated vertically between the source region and the drift region;
   at least one gate region horizontally adjacent to the channel region;
   a gate dielectric that electrically insulates the gate region from the channel region, a boundary surface between the gate dielectric and the channel region and/or the gate dielectric having negative boundary surface charges;
   a p-doped gate shielding region that is situated below the gate region in such a way that, in a vertical projection, the gate shielding region lies at least partly within a surface limited by the gate dielectric;

a source contact that is connected in electrically conductive fashion to the source region; and an electrically conductive region between the gate region and the p-doped gate shielding region;

wherein the p-doped gate shielding region is connected in electrically conductive fashion to the source contact by the electrically conductive region.

2. The vertical fin field-effect transistor as recited in claim 1, wherein the electrically conductive region includes polysilicon, and/or includes a conductive layer that has metal or a nickel silicide.

3. The vertical fin field-effect transistor as recited in claim 1, wherein the semiconductor fin includes silicon carbide and/or gallium nitride.

4. The vertical fin field-effect transistor as recited in claim 1, wherein the channel region has a width in a range from 50 nm to 400 nm, and a doping concentration in the channel region is in a range of $10^{15}$ cm$^{-3}$ to $10^{17}$ cm$^{-3}$.

5. The vertical fin field-effect transistor as recited in claim 1, further comprising:

at least one spreading region that is more highly n-doped than is the drift region.

6. The vertical fin field-effect transistor as recited in claim 5, wherein the at least one spreading region includes a first spreading region that is situated below and around a lower region of the gate shielding region, and includes a second spreading region laterally adjacent to the gate shielding region over the first spreading region, the second spreading region being more highly doped than the first spreading region.

7. The vertical fin field-effect transistor as recited in claim 6, wherein the second spreading region extends into a lower region of the fin into a region adjacent to the electrically conductive region.

8. A fin field-effect transistor system, comprising:

a plurality of vertical fin field-effect transistors, each of the vertical fin field-effect transistors including:
a semiconductor fin,
an n-doped source region,
an n-doped drift region,
an n-doped channel region in the semiconductor fin, situated vertically between the source region and the drift region,
at least one gate region horizontally adjacent to the channel region,
a gate dielectric that electrically insulates the gate region from the channel region, a boundary surface between the gate dielectric and the channel region and/or the gate dielectric having negative boundary surface charges,
a p-doped gate shielding region that is situated below the gate region in such a way that, in a vertical projection, the gate shielding region lies at least partly within a surface limited by the gate dielectric,
a source contact that is connected in electrically conductive fashion to the source region, and
an electrically conductive region between the gate region and the p-doped gate shielding region,
wherein the p-doped gate shielding region is connected in electrically conductive fashion to the source contact by the electrically conductive region wherein the vertical fin field-effect transistors are situated parallel to one another in such a way that their p-doped gate shielding regions extend in a first direction.

9. The fin field-effect transistor system as recited in claim 8, further comprising:

a plurality of trenched p-doped regions that are situated parallel to one another below the p-doped gate shielding regions and in contact with the p-doped gate shielding regions, and that extend in a second direction.

10. The fin field-effect transistor system as recited in claim 9, wherein the second direction is different from the first direction.

11. A method for forming a vertical fin field-effect transistor, comprising the following steps:

forming a plurality of trenches in an n-doped semiconductor region in such a way that between each two of the trenches, a semiconductor fin is formed having an n-doped channel region that extends between an n-doped drift region and an n-doped source region;

p-doping semiconductor regions on a floor of each of the trenches to form respective p-doped shielding regions;

forming a dielectric layer on side walls of each of the trenches;

situating in each of the trenches electrically conductive material that is in electrically conductive contact with the respective shielding region situated thereunder;

forming a gate region in each of the trenches, over the electrically conductive material and electrically insulated therefrom.

12. The method as recited in claim 11, wherein the situating of the electrically conductive material includes forming a conductive layer that has metal or a nickel silicide, and/or a forming polysilicon regions in the trenches.

13. The method as recited in claim 11, wherein the trenches extend parallel to one another in a first direction, and the method further comprises:

forming a lower n-doped semiconductor region;

p-doping at least one elongated region in the lower n-doped semiconductor region, which extends in a second direction; and forming the n-doped semiconductor region on the lower n-doped semiconductor region and on the elongated region;

where the first direction being different from the second direction; and wherein the p-doping of the semiconductor regions on the floor of each of the trenches takes place in such a way that the p-doped shielding regions contact the elongated region.

* * * * *